(12) United States Patent
Neumann

(10) Patent No.: US 7,321,272 B2
(45) Date of Patent: Jan. 22, 2008

(54) DEVICE FOR DETECTING THE TEMPERATURE OF AN OSCILLATOR CRYSTAL

(75) Inventor: Markus Neumann, Nürnberg (DE)

(73) Assignee: NXP B.V., Eindhoven (NL)

( * ) Notice: Subject to any disclaimer, the term of this patent is extended or adjusted under 35 U.S.C. 154(b) by 85 days.

(21) Appl. No.: 10/551,966

(22) PCT Filed: Apr. 1, 2004

(86) PCT No.: PCT/IB2004/050380

§ 371 (c)(1),
(2), (4) Date: Oct. 5, 2005

(87) PCT Pub. No.: WO2004/091100

PCT Pub. Date: Oct. 21, 2004

(65) Prior Publication Data

US 2006/0267702 A1    Nov. 30, 2006

(30) Foreign Application Priority Data

Apr. 11, 2003 (EP) ................... 03100986

(51) Int. Cl.
*H03L 1/02* (2006.01)
*H03B 5/32* (2006.01)

(52) U.S. Cl. .................... 331/176; 331/66; 331/116 R; 331/158; 331/177 R

(58) Field of Classification Search ............... 331/65, 331/66, 68, 69, 70, 116 R, 116 FE, 116 M, 331/158, 176, 177 R
See application file for complete search history.

(56) References Cited

U.S. PATENT DOCUMENTS

| 3,197,616 | A | * | 7/1965 | Gade et al. ............... 219/413 |
| 3,581,239 | A | * | 5/1971 | Knutson ................... 332/124 |
| 4,985,687 | A | * | 1/1991 | Long ......................... 331/69 |
| 6,066,989 | A | * | 5/2000 | Knecht et al. ............... 331/18 |
| 6,208,213 | B1 | * | 3/2001 | Anastasyev et al. .......... 331/69 |
| 2001/0019292 | A1 | * | 9/2001 | Funahara et al. ............ 331/68 |
| 2003/0231073 | A1 | * | 12/2003 | Tanaka et al. .............. 331/158 |

* cited by examiner

*Primary Examiner*—Robert J. Pascal
*Assistant Examiner*—Ryan J Johnson

(57) ABSTRACT

In a device for detecting the temperature of an oscillator crystal 2, arranged on a carrier, in particular in a mobile radio apparatus, the detected temperature should be as exact as possible a replica of the temperature to which the oscillator crystal 2 is subjected. For this purpose, a temperature sensor 7 is arranged on the carrier 1 in such a way that it is subjected to the same ambient temperature as the oscillator crystal 2 or the oscillator-crystal housing 2'. The temperature sensor 7 and the oscillator crystal 2 are located so as to be electrically parallel.

11 Claims, 3 Drawing Sheets

DEVICE FOR DETECTING THE TEMPERATURE OF AN OSCILLATOR CRYSTAL

The invention relates to a device for detecting the temperature of an oscillator crystal that has a crystal vibrator in an oscillator-crystal housing, in particular in a mobile radio apparatus.

The textbook: Neubig, Briese; *"Das große Quarzkochlbuch"* [The big crystal cookbook], Franzis-Verlag, p. 51 to 54 describes how, in order to measure temperatures, the temperature dependency of the frequency of oscillator crystals can be used. The oscillator crystal serves per se for the temperature measurement. It is not provided in order to supply a particular operating frequency in an apparatus, such as a mobile radio apparatus or equipment used in entertainment electronics, automotive technology or medicine.

Described in JP 2001-077627 is a temperature-compensated, piezoelectric oscillator. In order to achieve a small size, a temperature compensation circuit with a thermistor in thick-film technology is applied to the rear wall of the housing of the oscillator circuit for direct analog temperature compensation. The thermistor is decoupled from the oscillator by the rear wall in respect of the temperature acting upon it. The temperature and the temperature gradient at the thermistor and at the frequency-determining element of the oscillator here deviate from each other to a greater or lesser extent.

Described in U.S. Pat. No. 4,862,110 is a Surface Acoustic Wave (SAW) resonator, which is tuned to its nominal frequency by temperature variation of the resonator. A regulated heating element is provided for this purpose.

It is an object of the invention to propose a device of the kind specified above in which the measured temperature is as exact as possible a replica of the temperature to which the oscillator crystal, or its crystal vibrator as the frequency-determining component, is subjected.

This object is achieved by means of the features as claimed in claim 1. Since, with this device, the detection of the temperature and the temperature gradient takes place on the oscillator crystal directly in terms of both time and space, it is precisely the temperature influencing the frequency response of the oscillator crystal that is detected by means of the temperature sensor. By virtue of this direct detection, no delays, inertia or deformations of the impulse response of the temperature propagation between the oscillator crystal and the temperature sensor occur. A precise compensation of the frequency error of the oscillator circuit of the oscillator crystal respectively occurring as a function of the temperature is thereby made possible. A software temperature compensation may take place by means of targeted influencing of the actuators serving for frequency correction.

The electrical parallel connection of the temperature sensor is advantageous because, as a result, the oscillator crystal with temperature sensor is a solely two-terminal component, which can be accommodated on a printed circuit board with minimal wiring requirement. The device permits a minimization of the number of components necessary for the temperature detection. These can be integrated into an integrated circuit. Because of the omission of external components, an inexpensive structure with a small space requirement and low susceptibility to error is guaranteed.

In a mobile radio apparatus, the device described solves the temperature detection problems that arise as a result of the fact that temperature gradients with different signs propagate in the mobile radio apparatus, wherein, on the one hand, self-heating occurs through energy loss and, on the other, heating or cooling occurs through the environment. The device described may also be used with other equipment, e.g. equipment used in entertainment electronics, medical engineering or automotive engineering.

In an embodiment of the invention, the temperature sensor is applied to a constant-current source or a constant-voltage source and an evaluation circuit which evaluates the temperature and/or the temperature gradients for compensation of the temperature-dependent resonant frequency of the oscillator crystal.

The invention will be further described with reference to examples of embodiments shown in the drawings, to which, however, the invention is not restricted.

Figure 1:
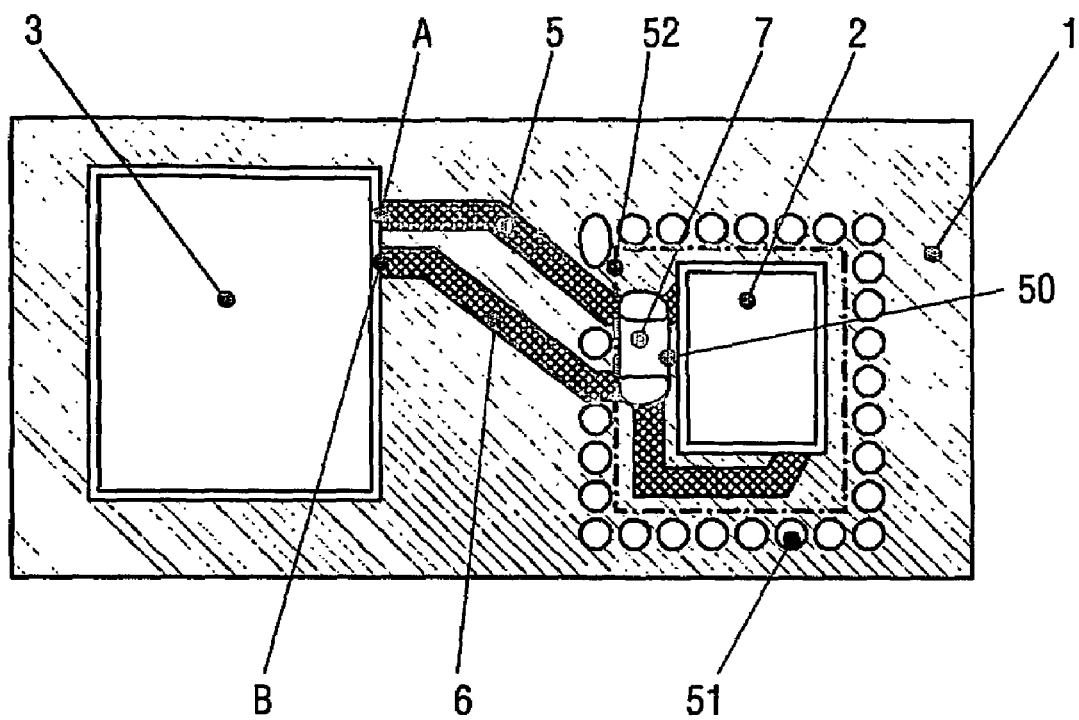
FIG. 1 shows a plan view of a temperature-dependent resistor (thermistor) in isothermal arrangement to an oscillator crystal on a printed circuit board.

In FIG. 1, a printed circuit board 1 of an apparatus, e.g. a mobile radio apparatus or an apparatus used in entertainment electronics, automotive technology or medical engineering, is provided as the carrier of a frequency-determining circuit, which is equipped with an oscillator crystal. Arranged on the printed circuit board 1 are an oscillator crystal 2 and an integrated circuit 3. The oscillator crystal 2 is equipped with an oscillator-crystal housing 2', in which is a crystal vibrator 4 (see FIG. 2), which is connected via printed lines 5, 6 of the printed circuit board 1 to terminals A and B of the integrated circuit 3.

Arranged on the printed circuit board 1 as a temperature sensor is a temperature-dependent resistor, especially the thermistor 7, which is electrically connected to the printed lines 5, 6 in parallel with the crystal vibrator 4. The thermistor 7 is arranged isothermally in relation to the oscillator-crystal housing 2' in the area 52. In particular, in the vicinity 50 of the oscillator-crystal housing 2', the thermistor 7 is arranged on the same side of the printed circuit board 1 as the oscillator-crystal housing 2' and not separated from it by a wall. It is thereby achieved that the temperature and the temperature gradient at the oscillator crystal 2, specifically at its crystal vibrator 4, and at the thermistor 7 are in essence identical. An additional thermal conduction means, e.g. heat transfer compound, may support the immediate vicinity 50 of the temperature sensor 7 at the oscillator-crystal housing 2'.

In order to increase the heat transfer resistance between the heat-emitting circuit 3 and the oscillator crystal 2, and thereby to support the isothermal arrangement in the area 52, openings 51 in the printed circuit board material may be provided in the printed circuit board 1.

It is then obvious that, as the temperature sensor, the thermistor 7 is subjected to the particular temperature and temperature gradient that have a frequency-determining effect on the crystal vibrator 4. The integrated circuit 3 contains the evaluation circuit that is further described below. It is spaced at a distance from the thermistor 7, so that its temperature scarcely affects the thermistor 7.

Figure 2:
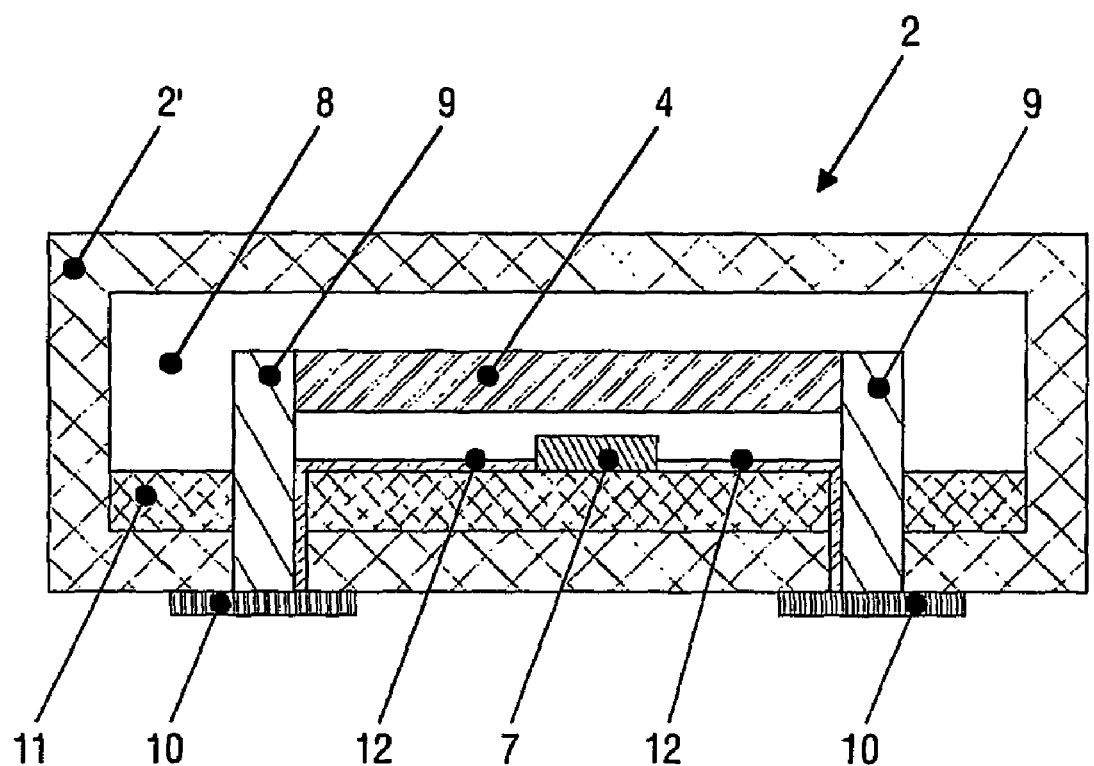
FIG. 2 shows, as an alternative to FIG. 1, a schematic sectional view of a thermistor inside an oscillator crystal housing.

FIG. 2 shows an oscillator crystal 2 in Surface-Mounted Device (SMD) design, wherein the thermistor 7 is arranged not, as in FIG. 1, adjacent to, but inside the oscillator-crystal housing 2'. The oscillator-crystal housing 2' of ceramic, metal or plastic, forms an inner chamber 8 filled with inert gas. Inside this, the crystal vibrator 4 is located on mountings 9. The crystal vibrator 4 is connected to oscillator-crystal terminals 10, which lead outwards. A base panel 11 of the oscillator-crystal housing 2' is suitable to act as a carrier for the attachment of components and lines, and takes the form of, for example, a printed circuit board.

The thermistor 7 is integrated into, or applied to, the base panel 11 serving as the carrier. It is located inside the inner chamber 8, as near as possible to the crystal vibrator 4, but must not touch the latter, since the oscillation properties could be negatively influenced as a result. The thermistor 7 is not separated from the crystal vibrator 4 by a wall, and is provided on the same side of the base panel 11 as the crystal vibrator 4. The thermistor 7 is connected by connecting leads 12 to the crystal terminals 10 in such a way that the crystal vibrator 4 and the thermistor 7 are electrically connected parallel to the oscillator-crystal terminals 10.

Figure 3:
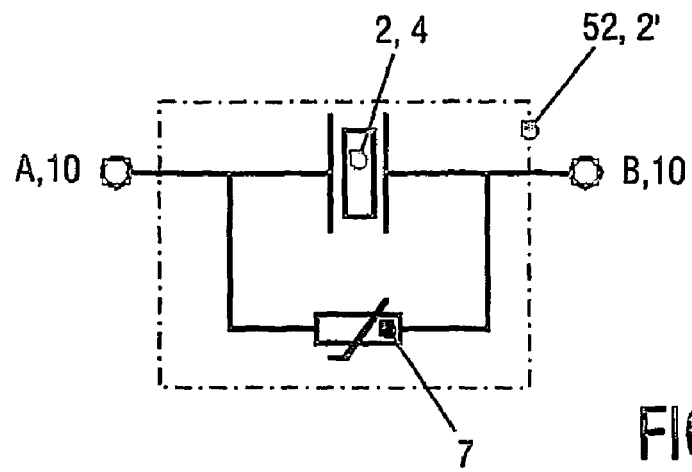
FIG. 3 shows the electrical parallel connection of an oscillator crystal or crystal vibrator and a thermistor.

FIG. 3 shows the parallel connection of the oscillator crystal 2, or the crystal vibrator 4, and to the thermistor 7. Given the typical values of a crystal-oscillator circuit, the thermistor 7 does not represent any significant additional load on the oscillator crystal. The thermistor 7 has, for example, a nominal ohmic resistance of approximately 30 kΩ.

Figure 4:
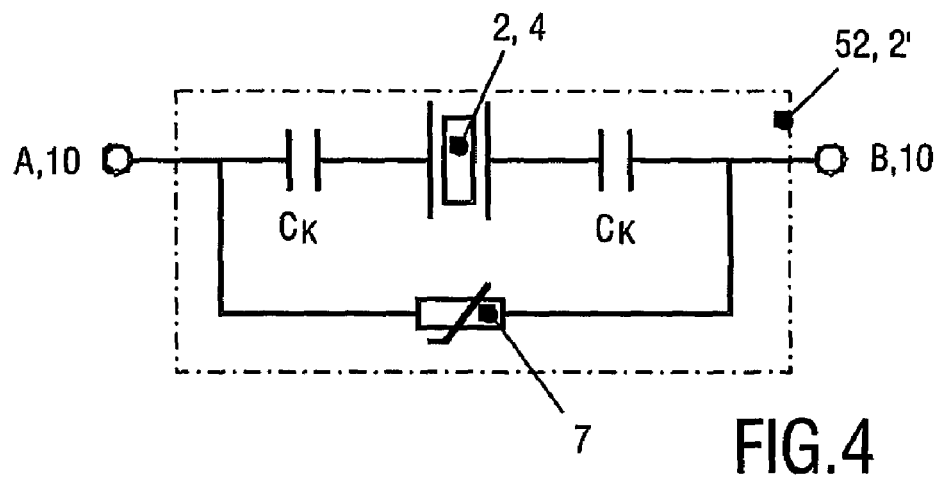
FIG. 4 shows a parallel connection of a thermistor with a series combination of an oscillator crystal or crystal vibrator and coupling capacitors.

In the case of the alternative shown in FIG. 4, coupling capacitors Ck are connected in series to the oscillator crystal 2, specifically the crystal vibrator 4. The thermistor 7 is connected parallel to this series connection. This layout too may be integrated into the oscillator-crystal housing 2' in the case of an arrangement as shown in FIG. 2. The coupling capacitors Ck are then arranged on the base panel 11.

In the case of a layout as shown in FIG. 1, this arrangement is applied to the isothermal area 52 of the printed circuit board 1.

In their operational mode, the coupling capacitors Ck separate the direct voltage to be applied to the thermistor 7, which is further described below, from the oscillator crystal 2, or the oscillator vibrator 4.

Figure 5:
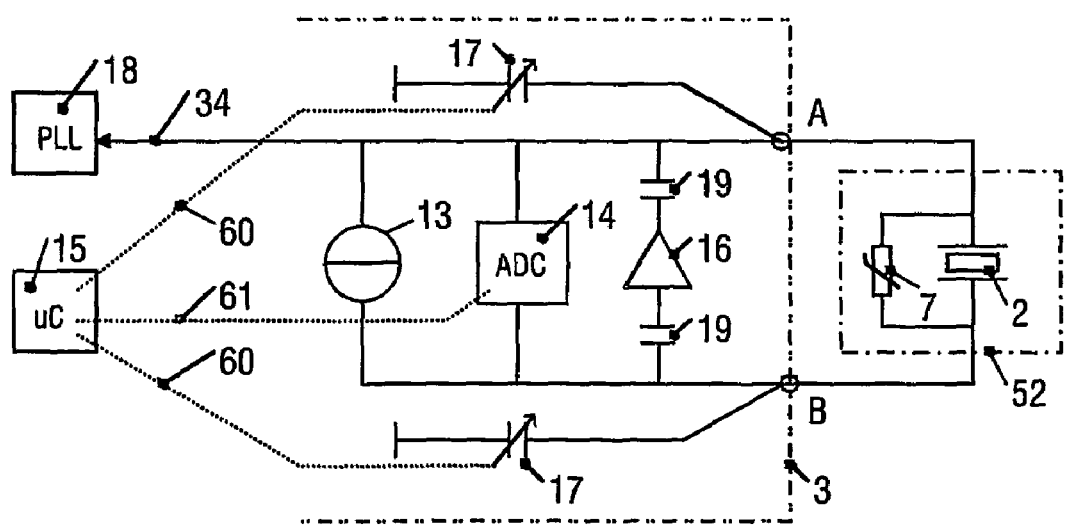
FIG. 5 shows a block circuit diagram of an evaluation circuit and an oscillator circuit with a constant-current source and the parallel connection as shown in FIG. 3.
Figure 6:
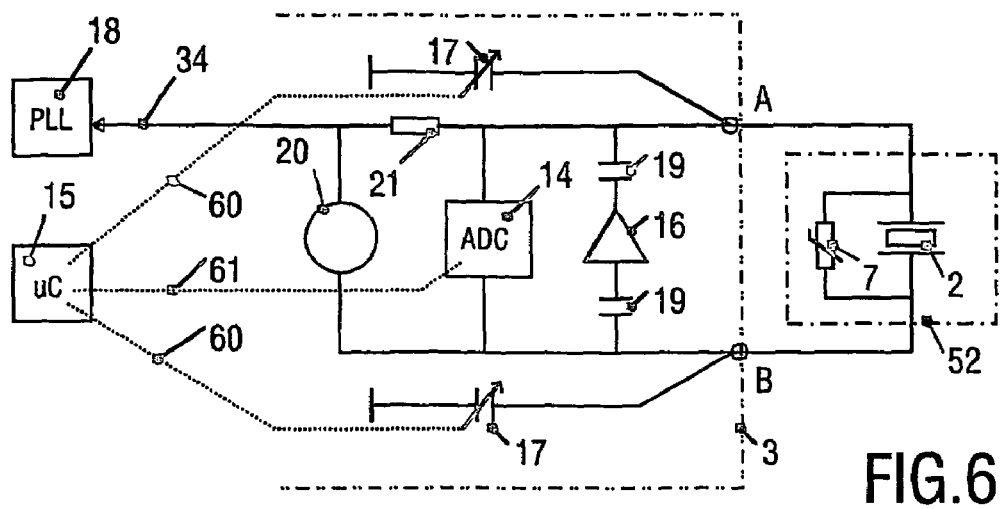
FIG. 6 shows a further version of the evaluation circuit with a constant-voltage source.
Figure 7:
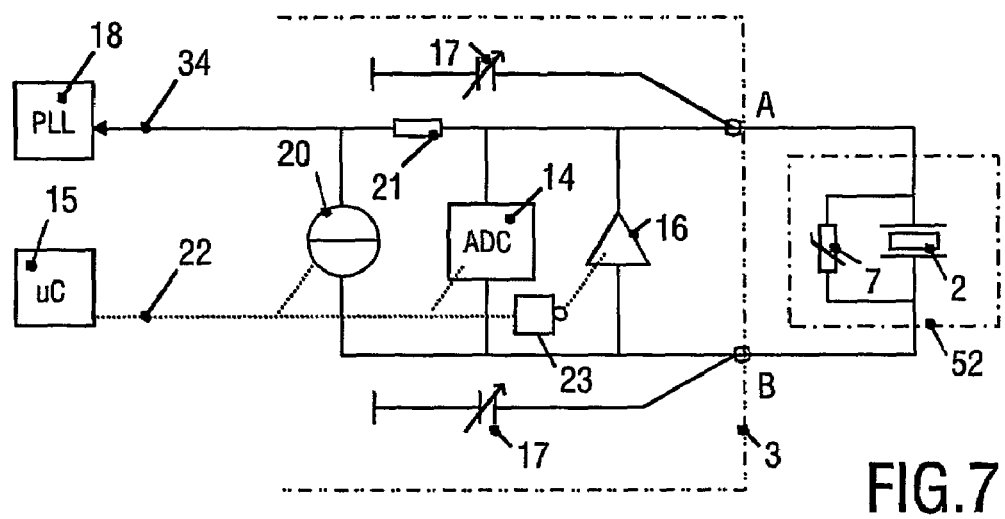
FIG. 7 shows a further version of the evaluation circuit with a constant-current source with sequential temperature measurement.

FIGS. 5, 6 and 7 show evaluation circuits and oscillator circuits that may be integrated into the integrated circuit 3. With the evaluation circuits, the temperature detected at the thermistor 7 can be evaluated in such a way that, as the end result, the temperature response of the resonant frequency of the oscillator crystal 2 is compensated. The thermistor 7 has a known resistance/temperature characteristic.

A constant current source 13 (see FIG. 5) impresses a constant current on the thermistor 7. As a result, a direct voltage, which corresponds to the present temperature-dependent resistance value of the thermistor 7, arises between the terminals A, B. This direct voltage is detected by an analog/digital converter 14, and sent digitally, via a data processing lead 61, to a microcontroller 15 of the apparatus. This microcontroller 15 determines the real-time temperature, e.g. from a voltage/temperature Table stored within it, which corresponds to the characteristic curve of the thermistor 7. The microcontroller 15 determines the voltage gradient or temperature gradient from sequential measurements.

An amplifier 16 serves to excite and maintain the high-frequency oscillations of the oscillator equipped with the oscillator crystal 2, which, as a Pierce oscillator, is equipped with capacitors 17 from terminal A and from terminal B to ground. The oscillator crystal 2, especially its crystal vibrator 4, with the amplifier 16 and the capacitors 17 forms an oscillator circuit The capacitors 17 are preferably integrated into the integrated circuit 3. In order to provide the facility of frequency control, the capacitors 17 may be adjustable in terms of their capacitance value. For the possibility of adjustment, the capacitors 17 are connected to the microcontroller 15 via control leads 60. The HF oscillations, e.g. 26 MHz, of the oscillator are passed on via a lead 34 from the terminal A to a phase-locked loop 18 of the apparatus.

In order that the operation of the amplifier 16 is not impaired by the direct-voltage path of the thermistor 7, coupling capacitors 19 are provided at the output and/or at the input of the amplifier 16.

In addition to the measurement direct voltage, the high-frequency signal voltage of the oscillator function is also present at the terminals A, B, and therefore also at the analog/digital converter 14. The high-frequency signal voltage is eliminated by signal processing measures, e.g. a low-pass filtration, in the analog/digital converter 14 or in the microcontroller 15, so that only the direct-voltage measurement signal is used for the further processing in the microcontroller.

In a further embodiment, the determination of the temperature or temperature change from the direct-voltage measurement may be assigned to the analog/digital converter 14 itself if it can have direct recourse to the characteristic curve of the thermistor 7. The microcontroller 15 can then signal, via the lead 34, that large temperature gradients are currently occurring.

In the case of the evaluation circuit as shown in FIG. 6, a constant-voltage source 20 is provided instead of the constant-current source. In addition, a resistor 21 is integrated into the integrated circuit 3. Together with the thermistor 7, the resistor 21 forms a voltage divider, so that, here again, a direct voltage that is dependent on the temperature arises between the terminals A and B.

In the case of the embodiments as shown in FIGS. 5 and 6, the direct-voltage measurement serving for temperature detection and the oscillator operation take place simultaneously. Conversely, in the embodiment as shown in FIG. 7, the direct-voltage measurement and the oscillator operation take place sequentially in cycles. An enable-signal lead 22, controlled by the microcontroller, is provided for this purpose. Either the constant-current source 13 and the analog/digital converter 14 are switched on via this, or the amplifier 16 is switched on via an inverter 23 for the enable signal. In this way, the temperature can be detected before the operation of the oscillator circuit, and, if applicable, a temperature compensation of the oscillator frequency or a temperature calibration can be undertaken.

With this layout, the coupling capacitors 19 (see FIGS. 5 and 6) and the coupling capacitors Ck (see FIG. 4) are superfluous. For the sake of clarity, the control leads 60 and 61 are omitted in FIG. 7, although they are used as shown in FIGS. 5 and 6.

In another embodiment, the analog/digital converter 14 may be arranged with spatial separation from the microcontroller 15. If the resistance/temperature characteristic curve of the thermistor 7 is known to it, the analog/digital converter 14 can detect that temperature gradients presently occurring exceed a previously-defined or programmable limit value. The analog/digital converter 14 can then signal this to the microcontroller 15 via a control lead.

FIGS. 5 to 7 show the case where no coupling capacitors Ck are provided in the isothermal area 52. The evaluation circuits of FIGS. 5 to 7 may, however, also be used if coupling capacitors Ck are arranged in the isothermal area 52 (see FIG. 4). The evaluation circuits in FIGS. 5 to 7 may also be used if, as shown in figure the thermistor 7 is arranged inside the oscillator-crystal housing 2' with or without coupling capacitors Ck.

Figure 8:
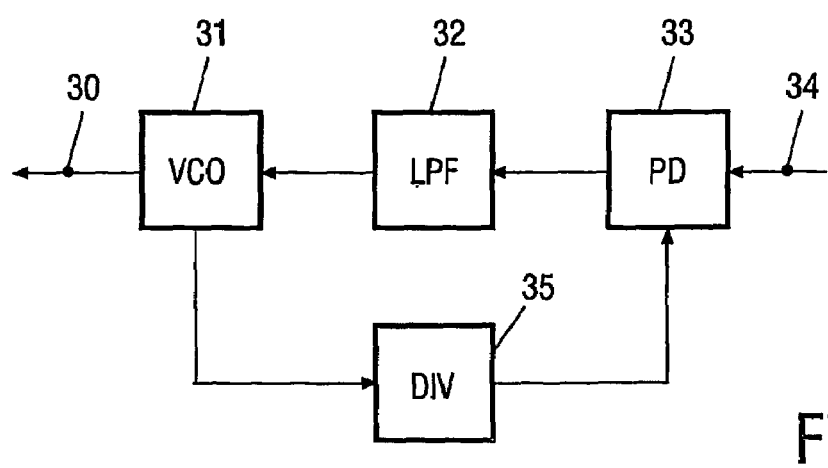
FIG. 8 shows a detailed representation of a phase-locked loop.

FIG. 8 shows the principle of the phase-control loop 18 (see FIGS. 5, 6 and 7). It derives the output frequency occurring at an output 30 of a voltage-controlled oscillator 31 from the reference frequency occurring on the lead 34, i.e. at terminal A, with phase-locking and frequency-locking. To develop the phase-locked loop, a divider 35, a phase comparator 33 and a loop filter 32 axe provided adjacent to the voltage-controlled oscillator 31.

The divider 35 can set fractional-rational division ratios in virtually any degree of fineness-stepping. It is a known fractional N divider. In the alternative as shown in FIG. 8, there is a special feature in that the reference frequency originating from the crystal oscillator circuit (see FIG. 5) on the lead 34 is not, as described above, tracked to its nominal value by variation of the capacitances of the capacitors 17. Instead, the reference frequency maintains its temperature-dependent frequency departure and it is achieved, through an appropriate, finely-stepped reprogramming of the divider 35, that the frequency at the output 30 exhibits the nominal frequency value. The reprogramming of the divider 35 takes place via a data lead (not shown) from the microcontroller 15. The temperature information present in the microcontroller 15 hereby brings about a temperature compensation of the output frequency at the output 30.

The frequency tracking, i.e. temperature compensation, can therefore take place either via a readjustment of the capacitors 17 or, alternatively, via an appropriate reprogramming of the divider 35.

The temperature information obtained may also be used for other purposes. For example, it may additionally be used in a mobile radio apparatus for calibrating other temperature-dependent parameters or for safety shutdown when a battery is charged.

The invention claimed is:

1. A device for detecting the temperature of an oscillator crystal that has a crystal vibrator in an oscillator-crystal housing, in particular in a mobile radio apparatus, wherein a temperature sensor is arranged on a carrier in such a way that it is subjected to the same ambient temperature as the oscillator crystal, or the crystal vibrator, wherein the temperature sensor is provided on the same side of the carrier as the oscillator crystal, or the crystal vibrator respectively, and is not separated from the oscillator crystal, or from the crystal vibrator, by a wall or by intervening circuit elements, and that the temperature sensor is electrically connected parallel to the terminals of the crystal vibrator or to a series connection of the crystal vibrator and at least one coupling capacitor, wherein a characteristic curve of the temperature sensor is stored in an evaluation circuit coupled to the temperature sensor.

2. A device as claimed in claim 1, wherein the temperature sensor is arranged in the oscillator crystal housing.

3. A device as claimed in claim 1, wherein the temperature sensor is arranged on a printed circuit board adjacent to the oscillator crystal housing.

4. A device as claimed in claim 1, wherein the carrier exhibits openings between the heat-emitting circuit and the oscillator crystal.

5. A device as claimed in claim 1, wherein the temperature sensor is coupled to a constant-current source or a constant-voltage source, and the evaluation circuit which evaluates the temperature and/or the temperature gradient for compensation of the temperature-dependent resonant frequency of the oscillator crystal.

6. A device as claimed in claim 1, wherein the resistance/temperature characteristic curve of the temperature sensor is stored in the evaluation circuit.

7. A device as claimed in claim 5, wherein the evaluation circuit is equipped with a measurement path in which the constant-current source or constant-voltage source, the temperature sensor and an analog/digital converter to detect the voltage drop at the temperature sensor are provided, and with an oscillator path in which an oscillator circuit comprising the oscillator crystal with an amplifier and at least one capacitor are provided.

8. A device as claimed in claim 7, wherein the measurement path and the oscillator path are separated from each other by filtering means.

9. A device as claimed in claim 1, characterized by an oscillator circuit in which the oscillator crystal is located and the constant-current source or the constant-voltage source can be applied sequentially, one after the other, to the parallel connection of the oscillator crystal, comprising a serial coupling capacitor, and the temperature sensor.

10. A device as claimed in claim 5, wherein the capacitance value of at least one capacitor which forms an oscillator circuit with the oscillator crystal can be readjusted by means of the evaluation circuit as a function of the detected temperature or temperature gradient.

11. A device as claimed in claim 5, wherein the dividing ratio of an adjustable divider of a phase-locked loop can be adjusted by means of the evaluation circuit as a function of the detected temperature or temperature gradient.

* * * * *